US011876311B2

(12) United States Patent
Leger et al.

(10) Patent No.: US 11,876,311 B2
(45) Date of Patent: Jan. 16, 2024

(54) SENSOR DEVICE AND GROUNDING CONNECTION

(71) Applicant: MEAS France, Toulouse (FR)

(72) Inventors: Vincent Leger, Toulouse (FR); Yannick Vidal, Toulouse (FR); Jerome Duclos, Toulouse (FR)

(73) Assignee: MEAS France, Toulouse (FR)

( * ) Notice: Subject to any disclaimer, the term of this patent is extended or adjusted under 35 U.S.C. 154(b) by 40 days.

(21) Appl. No.: 17/568,658

(22) Filed: Jan. 4, 2022

(65) Prior Publication Data

US 2022/0216628 A1 Jul. 7, 2022

(30) Foreign Application Priority Data

Jan. 5, 2021 (EP) ..................................... 21305008

(51) Int. Cl.
*H01R 12/58* (2011.01)
*H01R 12/52* (2011.01)

(52) U.S. Cl.
CPC ......... *H01R 12/585* (2013.01); *H01R 12/523* (2013.01)

(58) Field of Classification Search
CPC .... H01R 12/585; H01R 12/523; H01R 12/51; H01R 13/648; H01R 13/2407; H01R 13/533; H01R 13/627; H01R 13/639; G01D 11/245; H05K 9/0039; H05K 9/0064; H05K 7/00; H05K 9/0067

See application file for complete search history.

(56) References Cited

U.S. PATENT DOCUMENTS

| 4,436,222 A | | 3/1984 | Taylor et al. | |
| 5,315,877 A | * | 5/1994 | Park | G01L 19/069 73/718 |
| 5,904,597 A | * | 5/1999 | Doi | H01R 13/2442 439/924.1 |

(Continued)

FOREIGN PATENT DOCUMENTS

| EP | 3489479 A1 | 5/2019 |
| JP | S57133871 U | 8/1982 |

(Continued)

OTHER PUBLICATIONS

European Patent Office Extended Search Report, dated Jun. 17, 2021, App. No. 21305008.1-1203, 6 pages.

(Continued)

*Primary Examiner* — Truc T Nguyen
(74) *Attorney, Agent, or Firm* — Barley Snyder

(57) ABSTRACT

A sensor device includes an electrically conductive body adapted to accommodate a first printed circuit board (PCB) and a second PCB, a flexible electrically conductive device connecting the first PCB and the second PCB, and an electrically conductive spring held between the first PCB and the second PCB by a snap-fit, a form-fit or a press-fit connection. A first portion of the electrically conductive spring is pressed against one of the first PCB and the second PCB and a second portion of the electrically conductive spring is pressed against the electrically conductive body to maintain an electrical connection between the electrically conductive body, the first PCB, and the second PCB.

18 Claims, 9 Drawing Sheets

(56) References Cited

U.S. PATENT DOCUMENTS

| | | | |
|---|---|---|---|
| 6,945,118 B2* | 9/2005 | Maitland, Jr. | G01L 9/0051 |
| | | | 73/754 |
| 7,073,375 B2* | 7/2006 | Parker | F01N 9/002 |
| | | | 73/114.76 |
| 9,658,126 B2* | 5/2017 | Jones | G01L 19/148 |
| 9,810,566 B2 | 11/2017 | Grun et al. | |
| 10,429,213 B1* | 10/2019 | Golden | G01D 11/245 |
| 2008/0158823 A1* | 7/2008 | Tominaga | H01L 25/072 |
| | | | 361/709 |
| 2009/0120169 A1 | 5/2009 | Chandler, Jr. et al. | |
| 2009/0211357 A1 | 8/2009 | Pinto et al. | |
| 2009/0314096 A1* | 12/2009 | Colombo | G01L 19/147 |
| | | | 73/754 |
| 2010/0011871 A1* | 1/2010 | Bigliati | G01L 19/143 |
| | | | 73/756 |
| 2010/0182762 A1* | 7/2010 | Itomi | G01D 18/008 |
| | | | 361/807 |
| 2013/0033830 A1 | 2/2013 | Eckhardt et al. | |
| 2013/0033841 A1* | 2/2013 | Eckhardt | G01L 19/069 |
| | | | 361/784 |
| 2019/0033690 A1* | 1/2019 | Choi | G03B 17/55 |
| 2019/0376865 A1* | 12/2019 | Kim | G01L 19/0061 |
| 2021/0173126 A1* | 6/2021 | Lee | G02B 9/62 |
| 2021/0193977 A1* | 6/2021 | Reykhert | A61B 5/6833 |

FOREIGN PATENT DOCUMENTS

| | | |
|---|---|---|
| JP | S6443556 U | 3/1989 |
| JP | H330480 U | 11/1996 |
| JP | H1012337 A | 1/1998 |
| WO | 2019188847 U | 10/2019 |

OTHER PUBLICATIONS

Office Action from the Japanese Patent Office dated Jan. 4, 2023, corresponding to Application No. 2021-213586 with English translation, 13 pages.

* cited by examiner

SENSOR DEVICE AND GROUNDING CONNECTION

CROSS-REFERENCE TO RELATED APPLICATIONS

This application claims the benefit of the filing date under 35 U.S.C. § 119(a)-(d) of European Patent Application No. 21305008.1, filed on Jan. 5, 2021.

FIELD OF THE INVENTION

The present invention relates to the field of industrial sensor technologies, in particular to the electrical grounding of a sensor device.

BACKGROUND

Sensor devices, e.g. fluid sensor devices, may comprise a sensor, like a temperature sensor, and/or a mechanical resonator, like a tuning fork resonator. Sensor devices usually require interconnecting at least two Printed Circuit Boards (PCBs) and grounding the PCBs for electrostatic discharge (ESD) protection and for preventing electromagnetic interference (EMI noise).

Spring contacts, also known as spring fingers or ground contacts, are commonly used for grounding between a device and a PCB. Spring contacts are soldered onto a PCB. However, in many applications, like when the sensor device is implemented in a vehicle, vibrations can generate stress and fatigue on the solder joint between the spring contact and the PCB, thereby weakening the connection.

In some sensor devices known from the prior art, like the sensor device 10 represented in FIG. 1, the grounding of the PCBs 12, 14 is carried out by a pin 16 soldered to the electrically conductive body 18 of the sensor device 10 and the PCB 12. The PCBs 12, 14 are interconnected by a rigid connection device 20. For protecting and insulating PCBs 12, 14 and electronic components from the threats of harsh environments, the cavity 22 of the sensor device 10 can be filled with epoxy resin (this method is also known as PCB potting). Epoxy resin, however, due to its rigid material properties, does not allow dampening vibrations. Moreover, as it involves the installation of several elements (18, 20), as well as steps of soldering and potting, the manufacturability of such sensor device is affected.

SUMMARY

A sensor device includes an electrically conductive body adapted to accommodate a first printed circuit board (PCB) and a second PCB, a flexible electrically conductive device connecting the first PCB and the second PCB, and an electrically conductive spring held between the first PCB and the second PCB by a snap-fit, a form-fit or a press-fit connection. A first portion of the electrically conductive spring is pressed against one of the first PCB and the second PCB and a second portion of the electrically conductive spring is pressed against the electrically conductive body to maintain an electrical connection between the electrically conductive body, the first PCB, and the second PCB.

BRIEF DESCRIPTION OF THE DRAWINGS

The invention will now be described by way of example with reference to the accompanying Figures, of which:

FIG. 3b is a side view of the electrically conductive spring of FIG. 3a;

DETAILED DESCRIPTION OF THE EMBODIMENT(S)

Figure 1:
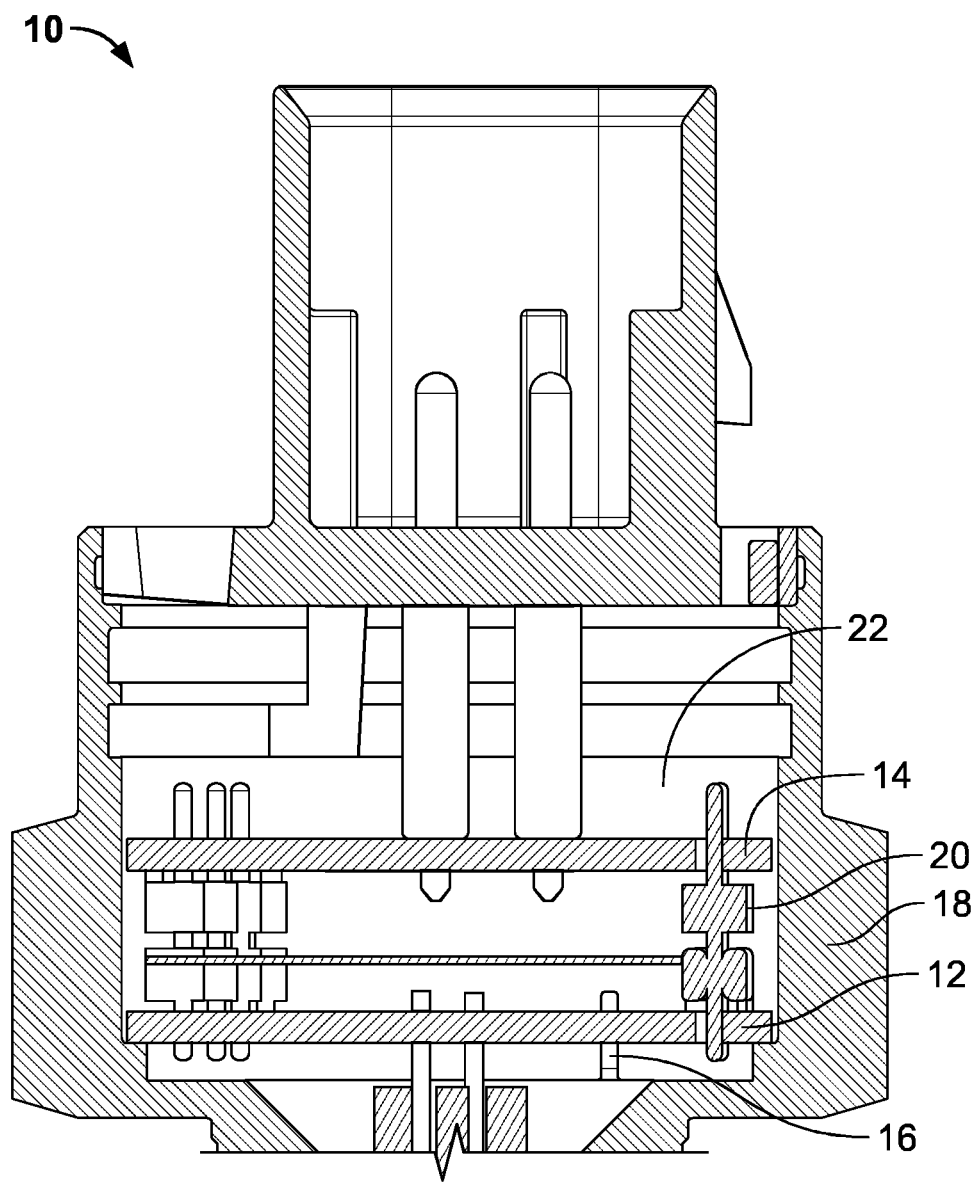
FIG. 1 is a sectional side view of a sensor device known from the prior art.

Features and advantages of the invention will be described with reference to the drawings. In the description, reference is made to the accompanying figures that are meant to illustrate embodiments of the invention. It is understood that such embodiments do not represent the full scope of the invention.

The accompanying drawings are incorporated into the specification and form a part of the specification to illustrate several embodiments of the present invention. These drawings, together with the description, explain the principles of the invention. The drawings are merely for the purpose of illustrating examples of how the invention can be made and used, and are not to be construed as limiting the invention to only the illustrated and described embodiments. Furthermore, several aspects of the embodiments may form—individually or in different combinations—solutions according to the present invention. The following described embodiments thus can be considered either alone or in an arbitrary combination thereof. Further features and advantages will become apparent from the following more particular description of the various embodiments of the invention, as illustrated in the accompanying drawings.

The present invention will now be described with reference to the attached Figures. Various structures, systems and devices are schematically depicted in the drawings for purposes of explanation only and so as to not obscure the present disclosure with details, which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein.

In the following, elements with the same reference numeral already described and illustrated with respect to one figure will not necessarily be described in detail again with respect to the other figures, but reference is made to the previous description of the same reference numeral.

Figure 2:
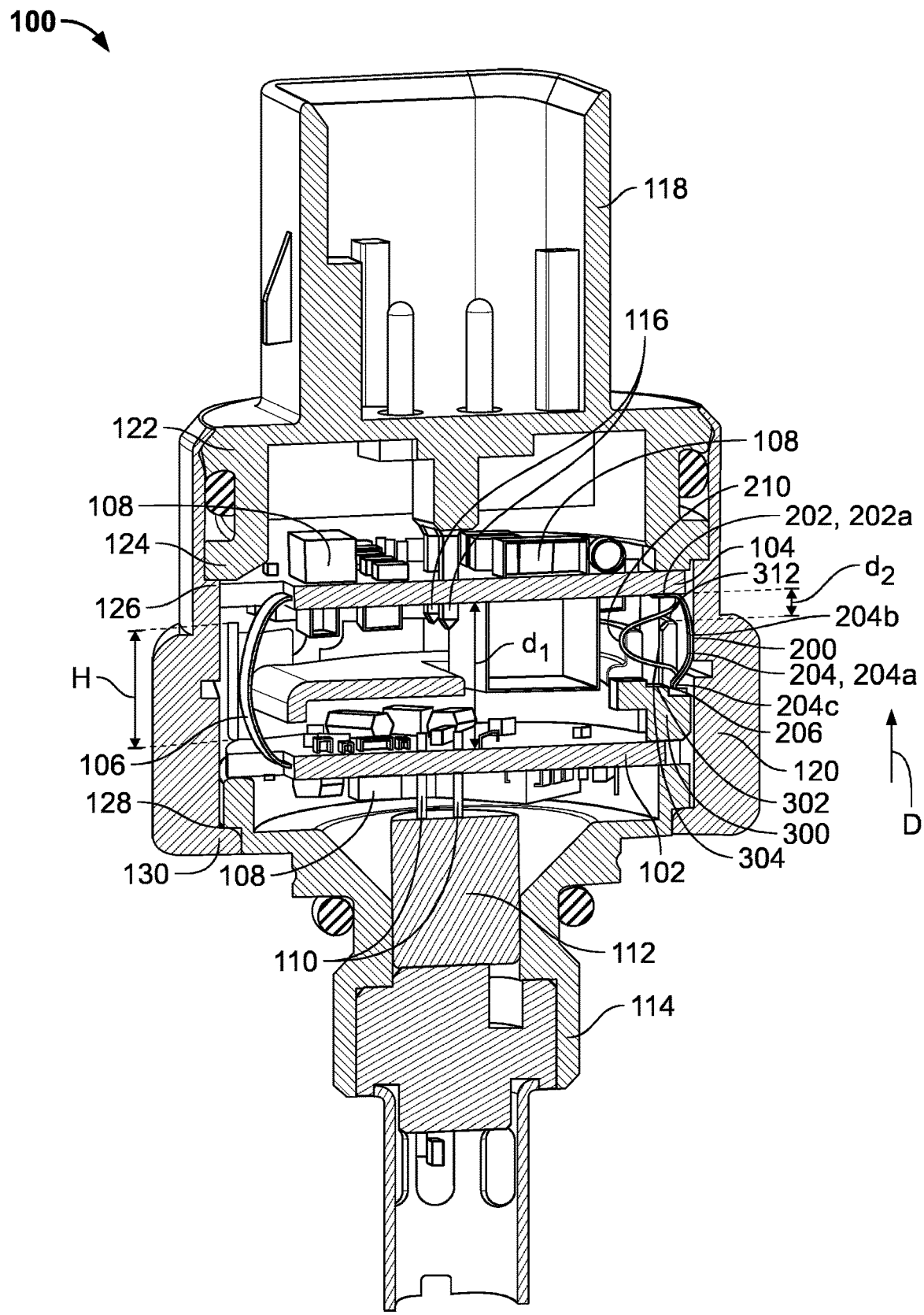
FIG. 2 is a sectional perspective view of a sensor device according to a first embodiment of the invention.

FIG. 2 illustrates a cut view of a sensor device 100 according to a first embodiment of the present invention. As represented in FIG. 2, a first PCB 102 is connected to a second PCB 104 by a flexible electrically conductive device 106. The flexible electrically conductive device 106 provides a flexible electrical connection between the first PCB 102 and the second PCB 104. The flexible electrically conductive device 106 can be a PCB flex or flexible PCB. The flexible electrically conductive device 106 is formed of a thin insulating polymer film having conductive circuit patterns affixed thereto. The use of a flexible electrically conductive device 106, like a flexible PCB 106, allows avoiding rigid interconnection between the first PCB 102 and the second PCB 104.

As shown in FIG. 2, electrical components 108 are connected onto each PCB 102, 104.

Terminal pins 110 are soldered to the first PCB 102. The terminal pins 110, also referred to herein as first terminal pins 110, extend from a terminal block 112 accommodated in a first assembly 114, like a header assembly 114 of the sensor device 100. Sensitive elements, like temperature sensor or a resonator, are connected to the first terminal pins 110. Terminal pins 116 are soldered to the second PCB 104. The terminal pins 116 are connectors for customer connection. The terminal pins 116 may also be referred to as second terminal pins 116.

A connector 118, constituting a second assembly element of the sensor device 100, is represented in FIG. 2. The connector 118 and the header assembly 114 are held together by an electrically conductive body 120. In the assembled state of the fluid sensor 100, as represented in FIG. 2, the electrically conductive body 120 is crimped to a first border 122 of the connector 118. The electrically conductive body 120 is further attached to the connector 118 by a form-fit connection between a second border 124 of the connector 118 and a corresponding step 126 of the electrically conductive body 120. A form-fit connection is also formed between a step 128 of the header assembly 114 and a border 130 of the electrically conductive body 120. The electrically conductive body 120 is thus adapted to accommodate the first PCB 102 and the second PCB 104.

To electrically ground the PCBs 102, 104 for electrostatic discharge (ESD) protection and for preventing electromagnetic interference (EMI noise), it is necessary to create an electrical connection between the PCBs 102, 104 and the electrically conductive body 120. The electrical grounding function is carried out by an electrically conductive spring 200. In the first embodiment of the invention, the electrically conductive spring 200 is disposed on a plastic holder 300. The plastic holder 300 is disposed between the two PCBs 102, 104 such that, in the assembled state of the fluid sensor 100, as shown in FIG. 2, a first portion 202 of the spring 200 is pressed against the second PCB 104. Moreover, a second portion 204 of the spring 200 is pressed against the electrically conductive body 120 so as to maintain an electrical connection between the electrically conductive body 120 and the PCBs 102, 104.

Figure 3A:
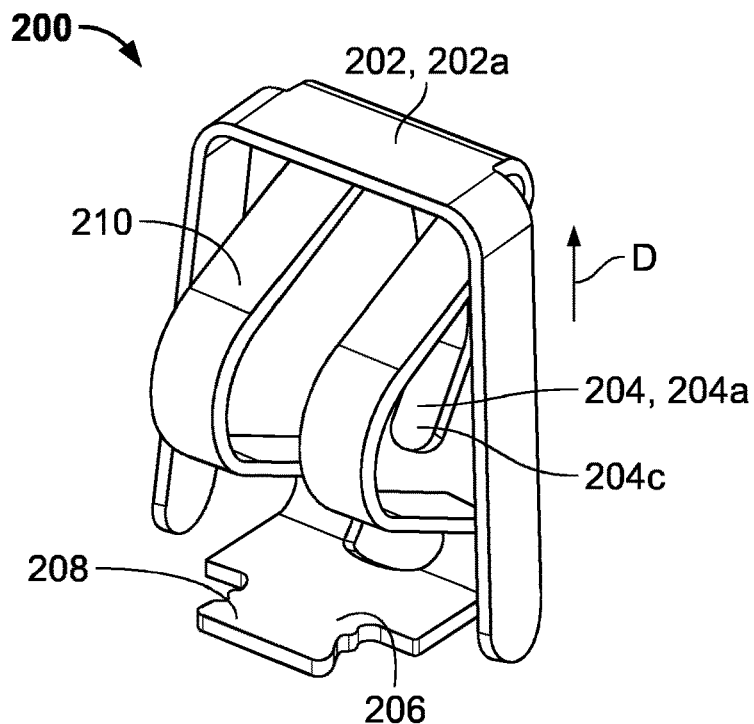
FIG. 3a is a perspective view of an electrically conductive spring of the sensor device of FIG. 2.
Figure 3B:
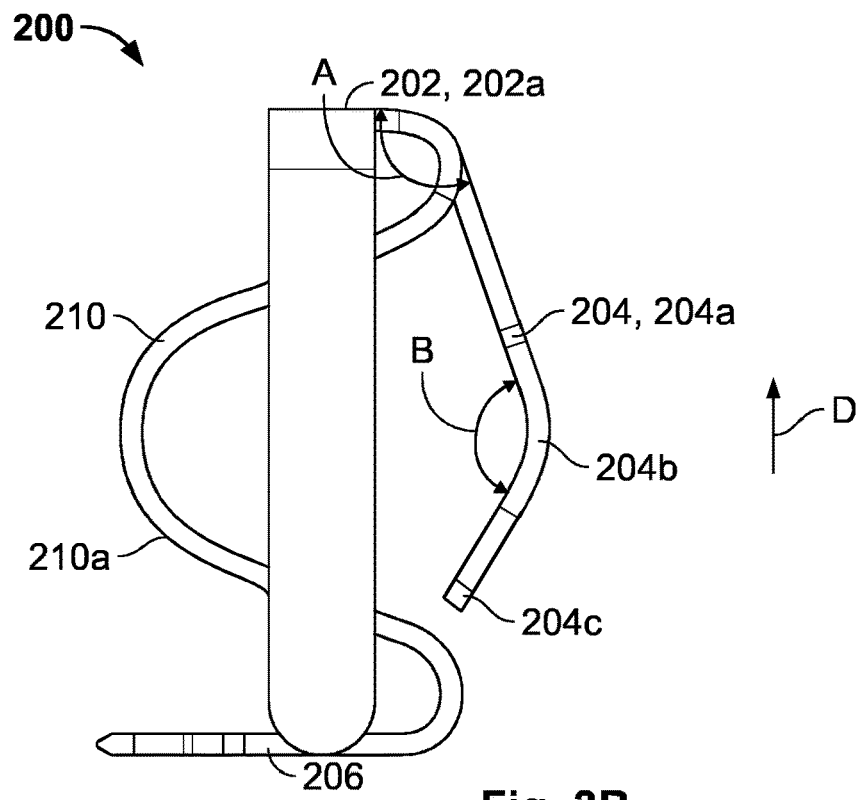

The structure of the spring 200 is shown in FIGS. 3a and 3b. The spring 200 for the sensor device 100 according to the first embodiment is further described in the following in reference to FIGS. 2, 3a and 3b.

The first portion 202 of the spring 200 is a flat portion 202a in a plan parallel to the surfaces of the PCBs 102, 104. The flat structure 202a of the first portion 202 provides a well-adapted contact surface for ensuring the electrical connection when the second PCB 104 is pressed against said first portion 202. In a variant, the first portion 202 is provided with a bump, the bump being pressed against said first portion 202 to further improve the electrical contact.

The second portion 204 is formed by a bent tab 204a, the apex 204b of which is pressed against the electrically conductive body 120 in the assembled state of the sensor device 100. The bent tab 204a extends from the first portion 202 in a direction to form an angle A from the flat first portion 202 (see FIG. 3b). The bent tab 204a has a free-end 204c.

As illustrated in FIG. 3b, the angle A between the first portion 202 and the second portion 204 and the angle B at the apex 204b of the second portion 204 are both adapted for allowing the apex 204b to be pressed against the electrically conductive body 120 in the assembled stated of the device sensor 100 (the assembled state is shown in FIG. 2). The first portion 202 and the second portion 204, in particular at the apex 204b, can be covered by an electrically conductive layer to further improve the electrical contact. Such electrically conductive layer can be formed of gold plating over a nickel plating layer.

The spring 200 has a flat base portion 206 adapted to rest on a corresponding base 302 of a receptacle 304 of the plastic holder 300, as shown in FIGS. 2, 3a, and 3b. For improving the retention of the spring 200, a tongue 208 (see FIG. 3a) of the base 206 of the spring 200 can be bent, i.e. crimped, to the base 302 of the plastic holder 300. The base 206 is geometrically opposed to the first portion 202.

The spring 200 further comprises a third portion 210 extending between the first portion 202 and the base 206, so that the third portion 210 does not have any free end. The third portion 210 of the spring 200 is configured to be in a preloaded state between the two PCBs 102, 104 (as illustrated in FIG. 2). The third portion 210 is thus structurally configured for imparting a sufficient spring force along a direction transversal D to the PCBs 102, 104 so as to provide strain relief to the PCBs 102, 104. The third portion 210 acts as a compression spring exerting its restoring force along the direction D. As shown in FIG. 3b, the third portion 210 is a three-point bent tongue 210a. The shape of the third portion 210 advantageously allows increasing the working stroke of the spring 200 while having a reduced bulk. In a variant, the third portion 210 acts as a compression spring but has a different structure than the design of the three-point bent tongue 210a of the spring 200 shown in FIGS. 2, 3a and 3b.

The electrically conductive spring 200 allows not only providing a grounding function but, in addition, a stress relief function which improves the retention of the PCBs 102, 104, especially under vibrations, as no stress is caused on and by rigid connections (like solder joints). Hence, the two functions of electrical grounding and strain relief of the PCBs 102, 104 are advantageously carried out by one single component, the electrically conductive spring 200, that can be assembled to the sensor device 100 without the need of a soldering step.

As can be seen in FIG. 2, in the assembled state of the fluid sensor 100, the plastic holder 300 is disposed between the two PCBs 102, 104, such that only the first PCB 102 is in direct surface contact with the plastic holder 300 and only the second PCB 104 is in direct surface contact with the spring first portion 202 of the spring 200. This is rendered possible by the specific dimensions of the spring 200 and the plastic holder 300 as well as by the arrangement of the spring 200 with respect to the plastic holder 300. This feature is further described with respect to FIG. 4.

Figure 4:
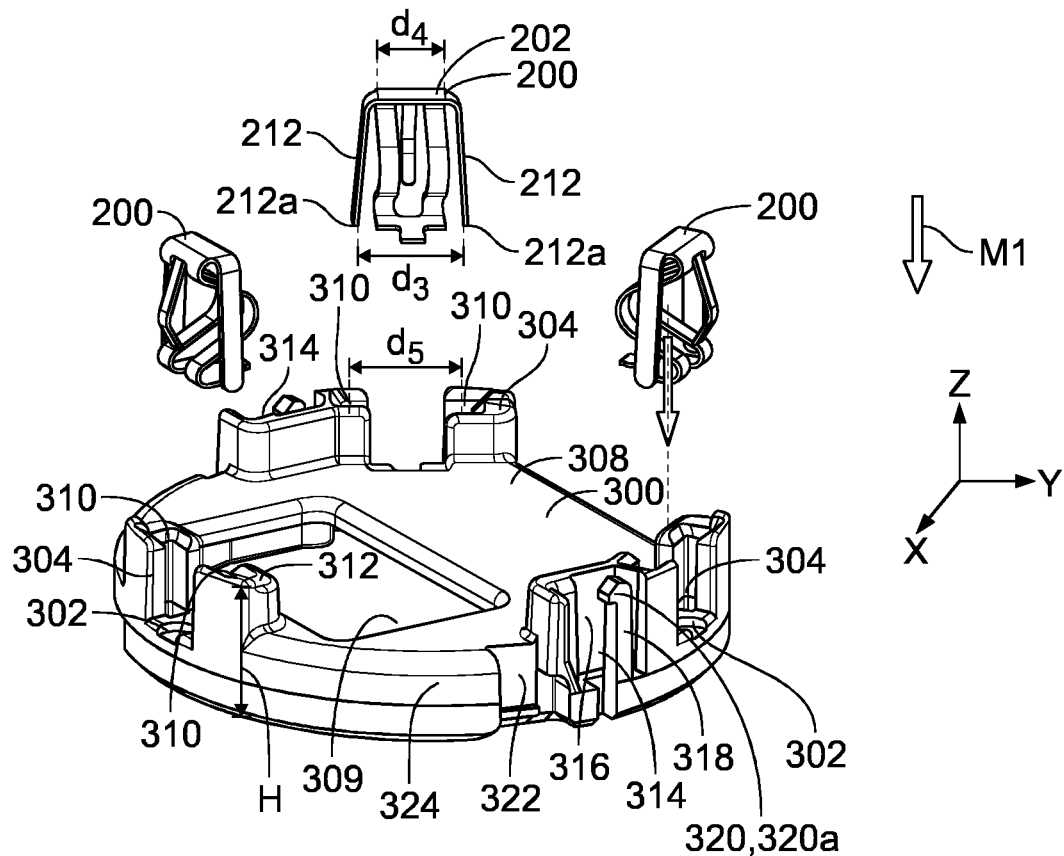
FIG. 4 is a perspective view of a plastic holder and three electrically conductive springs of the sensor device of FIG. 2.

FIG. 4 illustrates a plastic holder 300 adapted for receiving three springs 200 for a sensor device 100 according to the first embodiment. In a variant, the plastic holder 300 is adapted for receiving only one spring 200. In another variant, the plastic holder 300 is adapted for receiving two, four or more springs 200.

The plastic holder 300, as shown in FIG. 4, comprises a base 308. The base 308 can be provided with one or more holes 309 to accommodate the electrical component(s) 108 connected to the first PCB 102. The plastic holder 300 is one-piece integrally formed, by injection molding for example, thereby being easily manufacturable.

As shown in FIG. 4, three receptacles 304 extend transversally from the base 308, i.e. along a direction parallel to the Z-direction of the Cartesian coordinates. Each receptacle 304 comprises a base 302 to support the base 206 of the spring 200. Each receptacle 304 is formed by two grooves 310 facing each other towards the base 302. The grooves 310 are positioned on the base 308 and spaced from each other such that when a spring 200 is received therein, it allows the second portion 204 and the third portion 210 of the spring 200 to protrude outwards from the grooves 310 (the protruding aspect is even more visible on the right side of the view of FIG. 5). Hence, the grooves 310 allows the retention of the spring 200 without hindering the contact between the second portion 204 and the electrically conductive portion 120 in the assembled state of the sensor device 100 (as illustrated in FIG. 2) nor the strain relief function carried out by the third portion 210 of the spring 200. The receptacles 304 of the plastic holder 300 provide a holding feature for the mounting of the spring 200 without the need of any fastener.

The total height H between the highest point 312 of the groove 310 and the base 308 of the plastic holder 300 is dimensioned so as to be smaller than the distance d1 between the two PCBs 102, 104 in the assembled state of the sensor device 100 (as illustrated in FIG. 2). Hence, a gap of height d2 (see FIG. 2) is comprised between the highest point 312 of the plastic holder 300 and the second PCB 104 in the assembled state of the sensor device 100. Hence, as shown in FIG. 2, only the first PCB 102 is in direct surface contact with the plastic holder 300, which lies on the first PCB 102. The gap d2 between the plastic holder 300 and the second PCB 104 provides sufficient space for strain relief, i.e. for allowing the third portion 210 of the spring 200 to exert its restoring force. Consequently, it allows, for example under vibrations, a mutual movement of the PCBs 102, 104 that is not affected by any rigid interconnection, in comparison with fluid sensor of the state of start, as illustrated in FIG. 1 for example.

Figure 5:
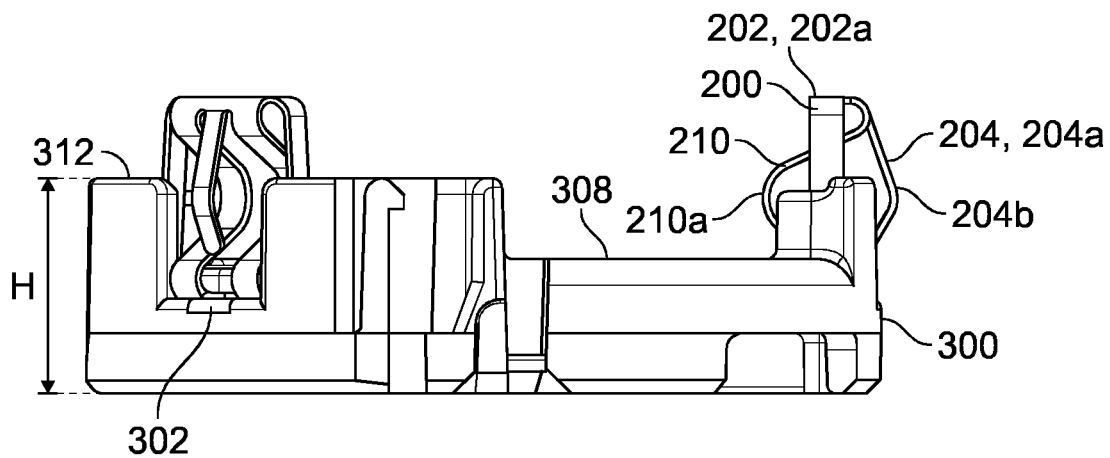
FIG. 5 is a side view of the electrically conductive springs mounted to the plastic holder of FIG. 4.

In order to facilitate the mount of the spring 200 to the plastic holder 300 and to improve its retention into the receptacle 304, the spring 200 further comprises two guiding arms 212. As shown in FIGS. 3a and 4, the guiding arms 212 extend from the first portion 202 towards the base 206. The guiding arms 212 extend on different sides than the second portion 204 and the third portion 210. The guiding arms 212 are adapted to be respectively received in the grooves 310 of each receptacle 304 of the plastic holder 300 in order to provide stability to the spring 200. As indicated in FIG. 4, the distance d3 between the two free-ends 212a of the guiding arms 212 (see FIG. 4) is substantially greater than the distance d4 of length of the first portion 202 of the spring 200 and of the distance d5 between the grooves 310 of a same receptacle 304. It allows, when the spring 200 is received into the receptacle 304 of the plastic holder 300, as shown in FIG. 5, to keep the guiding arms 212 of the spring 200 slightly under stress. It therefore improves the retention of the spring 200 within the receptacle 304 and its grooves 310 because it prevents the spring 200 to tip over from the receptacle 304 when the apex 204b of the second portion 204 is pressed against the electrically conductive body 120 (the electrically conductive body 120 is shown in FIG. 2). The at least one guiding arm 212 allows facilitating the mounting of the spring 200 to the receptacle 304 by providing a guiding feature to the spring 200. It also allows ensuring a correct positioning of the spring 200 with respect to the plastic holder 300.

In order to maintain the plastic holder 300 to the header assembly 114 and the connector 118, snap-fit, press-fit or/and form-fit connections between the plastic holder 300 and the header assembly 114, as well as between the plastic holder 300 ad the connector 118 are performed. Snap-fit, press-fit or/and form-fit connections allow easy assembly steps and do not require the use of any tools. Hence, the manufacturing of the sensor devise 200 can be simplified.

As shown in FIG. 4, the plastic holder 300 comprises two receptacles 314 respectively adjacent to receptacles 304 already described above. Each receptacle 314 comprises a space 316 adapted for receiving a locking arm of the connector 118 (the locking arm of the connector 118 will be described hereafter with respect to the FIGS. 6 to 8). Each receptacle 314 also comprises a receptacle locking arm 318 extending from the base 308 and having a free-end 320 with a hook shape 320a. The hook shape 320a of the locking arm 318 of the plastic holder 300 is adapted to perform a snap-fit connection with a corresponding locking arm of the connector 118 in the assembled stated of the sensor device 100. It thus allows maintaining the plastic holder 300 to the connector 118 by a snap fit connection.

As shown in FIG. 4, the plastic holder 300 is further provided with a recess 322 on a circumference 324 of the base 308. The recess 322 has a shape complementary to a corresponding locking element protruding from the head assembly 114 (the locking element protruding from the head assembly 114 will be described hereafter with respect to the FIG. 6). Hence, a form-fit connection can be carried out between the plastic holder 300 and the head assembly 114. In a variant, the plastic holder 300 can be attached to the head assembly 114 by a snap-fit or a press-fit connection.

A method for assembling the sensor device 100 according to the first embodiment is described in the following with respect to FIGS. 4 to 8.

FIG. 4 illustrates a step of the method for assembling the sensor device 100 wherein three distinct springs 200 are mounted to the plastic holder 300. Each spring 200 is inserted along an insertion direction M1 transversal to the base 308 and parallel to the grooves 310 (i.e. parallel to the Z direction of the Cartesian coordinate) until the base 206 of the spring 200 is in contact with the base 302 of the receptacle 304. The tongue 208 of the spring 200 can be crimped to the base 302 of the plastic holder 300 to improve the retention of the spring 200 to the plastic holder 300.

As shown in the following step represented in FIG. 5, each spring 200 is received in a respective receptacle 304 of the plastic holder 300. The guiding arms 212 of each spring are received in the corresponding grooves 310 of each receptacle 304. The guiding arms 212 have helped guide the mount of the springs 200 to the receptacle 304. As the guiding arms 212 of the spring 200 are slightly under stress in the receptacle 304, it allows improving the retention of the spring 200 to the plastic holder 300.

Figure 6:
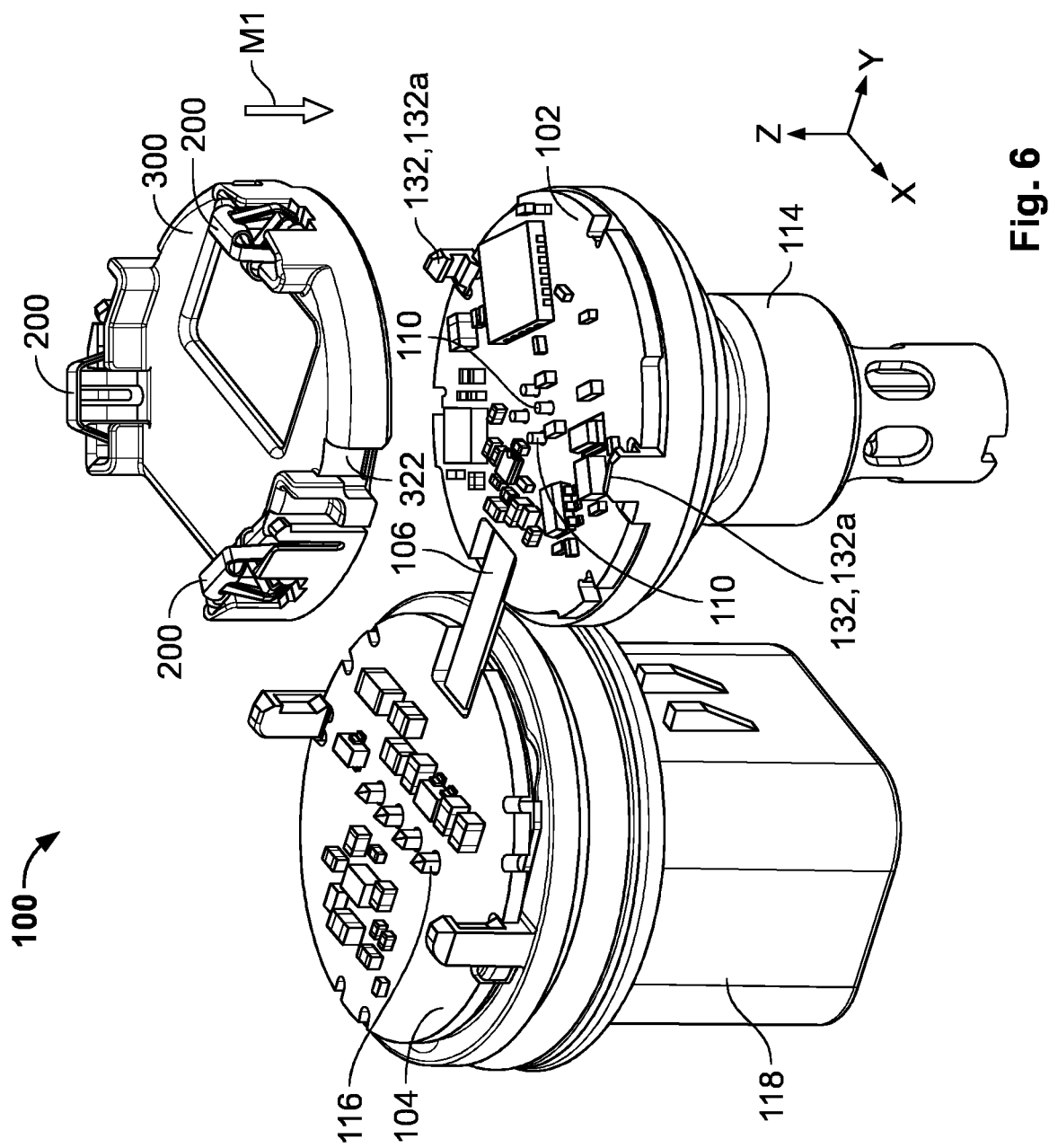
FIG. 6 is a perspective view of mounting the plastic holder on a PCB of the sensor device of FIG. 2.

As shown in FIG. 6, the first PBC 102 is connected to the header assembly 114. The second PCB 104 is connected to the connector 118. FIG. 6 illustrates a step wherein the header assembly 114 and the connector 118 of the sensor device 100 are positioned with respect to each other so as to align the PCBs 102, 104 and the flex PCB 106 in a common plane (XY). The pin terminals 110 are soldered to the first PCB 102 and the pin terminals 116 are soldered to the second PCB 104. The numbers of pin terminals 110, 116 is not limitative. The plastic holder 300, comprising the three springs 200, is positioned above the first PCB 102 so as to be assembled to the first PCB 102 along the insertion direction M1.

As shown in FIG. 6, two locking elements 132 protrude from the head assembly 114. The free-end 132a of each locking element 132 has a complementary shape of the corresponding recess 322 of the plastic holder 300. Hence, a form-fit connection between the plastic holder 300 and the locking elements 132 of the head assembly 114 is possible. The free end 132a of the locking element 132 can have a hook shape for providing a snap-fit connection with a corresponding step of the recess 322.

In the following step represented by FIG. 7, the plastic holder 300 is disposed onto the first PCB 102 being connected to the second PCB 104 by the flexible electrically conductive device 106. The plastic holder 300 has been assembled to the first PCB 102 along the insertion direction M1 (indicated in FIG. 6). Each locking elements 132 of the head assembly 114 is snap-fitted, form-fitted or press-fitted into the corresponding recess 322 of the plastic holder 300 thereby ensuring the retention of the plastic holder 300 to the head assembly 114.

Figure 7:
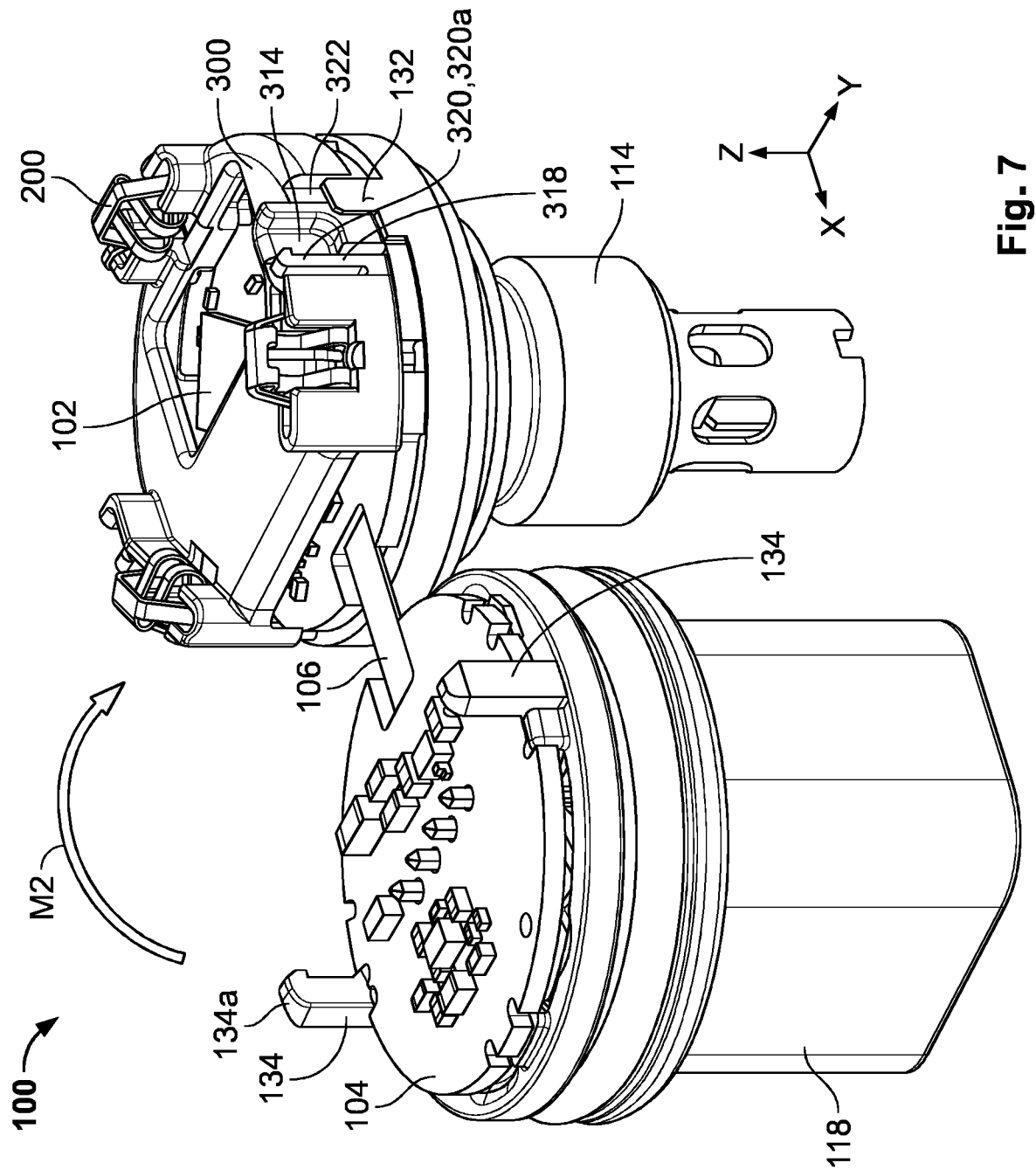
FIG. 7 is a perspective view of the plastic holder mounted on the PCB of the sensor device of FIG. 2.

As shown in FIG. 7, two connector locking arms 134 protrude from the connector 118. The free-end 134a of each locking arm 134 has a hook shape. Each locking arm 134 is adapted to be received in the corresponding receptacle 314 of the plastic holder 300. As already described above, each receptacle 314 also comprises a locking arm 318 extending from the base 308 and having a free-end 320 with a hook shape 320a. The hook shape 320a of the locking arm 318 of the plastic holder 300 is adapted to perform a snap-fit connection with the corresponding locking arm 134 of the connector 118 in the assembled stated of the sensor device 100. It thus allows maintaining the plastic holder 300 to the connector 118 by a snap fit connection, as shown in FIG. 8 and described thereafter.

Figure 8:
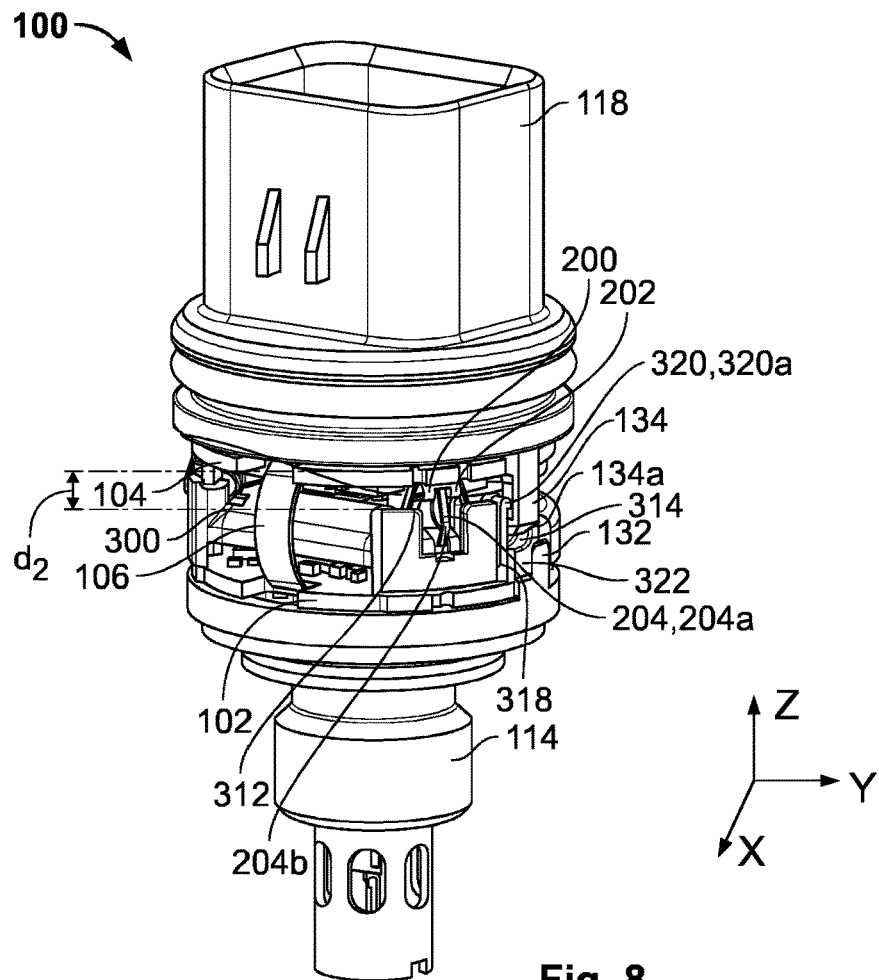
FIG. 8 is a perspective view of an assembled state of the sensor device of FIG. 2.

From FIG. 7 to FIG. 8, the connector 118 has been pivoted according to the direction M2 (shown in FIG. 7 by the arrow M2 representing a rotational axis, M2 being transversal to M1) so as to arrange the second PCB 104 over the plastic holder 300 (see FIG. 8). Thereby, the second PCB 104 is pressed against the flat first portion 202 of each spring 200 so as to ensure an electrical contact between the second PCB 104 and each spring 200.

Hence, FIG. 7 represents a step of the assembling method wherein the second PCB 104 connected to the connector 118, is moved pivotally onto the plastic holder 300 about the rotational axis (M2) transversal to the insertion direction M1 (said direction M1 is represented in FIG. 6).

Each locking arm 134 of the connector 118 is inserted into the space 316 of the receptacle 314 of the plastic holder 300. The connector 118 is snap-fitted to the plastic holder 300 by the mutual retention of the hook shape free-ends 134a, 320a of the locking arm 134 and the corresponding locking arm 318.

As shown in FIG. 8 and already described above with respect to FIG. 2, a gap of height d2 is provided between the highest point 312 of the plastic holder 300 and the second PCB 104. Hence, the gap d2 between the plastic holder 300 and the second PCB 104 provides sufficient space for strain relief, i.e. for allowing the third portion 210 of the spring 200 to exert its restoring force (the third portion 210 is in a preloaded state between the two PCBs 102, 104). Consequently, it allows, for example under vibrations, a mutual movement of the PCBs 102, 104 that is not affected by any rigid interconnection, in comparison with fluid sensor of the state of start, as illustrated in FIG. 1 for example.

As shown in FIG. 8, the second portion 204 of the spring 200 protrudes such that the apex 204b of the bent tab 204a extends beyond, in particular slightly beyond, the surfaces of the PCBs 102, 104. Hence, when the electrically conductive body 120 is assembled to the header assembly 114 and the connector 118, it will ensure that the protruding apex 204b is pressed against the electrically conductive body 120 so as to provide a reliable electrical contact between the spring 200 and the electrically conductive body 120.

In a step following the step illustrated by FIG. 8, the electrically conductive body 120 is assembled to the header assembly 114 and the connector 118 so as to provide the sensor device 100 in its assembled state as represented in FIG. 2.

As already described above, in the assembled state of the fluid sensor 100 represented in FIG. 2, the electrically conductive body 120 is crimped to a first border 122 of the connector 118. The electrical conductive body 120 is further attached to the connector 118 by a form-fit connection between a second border 124 of the connector 118 and a corresponding step 126 of the electrically conductive body 120.

Hence, the electrically conductive spring 200 mounted to the plastic holder 300 allows maintaining an electrical connection between the electrically conductive body 120 and the PCBs 102, 104, i.e. to perform the grounding function, without the need of being soldered to the PCBs 102, 104 or the electrically conductive body 120. Instead, the electrical connection between the electrically conductive spring 200 and the PCB 104 is simply achieved by pressing the first portion 202 of the spring 200 against the second PCB 104. Similarly, the electrical connection between the electrically conductive spring 200 and the electrically conductive body 120 is simply achieved by pressing the second portion 204, in particular the apex 204b of the bent tab 204a, of the spring 200 against the electrically conductive body 120. Consequently, with respect to the known solutions for electrical grounding in sensor device, no soldered joint—and thus no electrical connection—can be damaged by vibrations. The combination of the solder-free solution to assemble the electrically conductive spring 200 and the use of the PCB flex 106 allows avoiding the drawbacks caused by rigid connections, especially with respect to vibrations. Instead, the present invention provides a sensor device 100 without rigid connections between the two PCBs 102, 104. Moreover, as no soldering step is required to install the electrically conductive spring for ensuring the grounding function, the manufacturing is simplified, thereby improving the repeatability and reducing the cost of the assembly process. Consequently, the method for assembling a sensor device is rendered compatible for high volume production. In addition, as no specific soldering step is required for ensuring the grounding function, automation of the assembly process is rendered possible. Moreover, it allows providing a potting free assembly process, which improves further the manufacturability of the sensor device 100.

Figure 9:
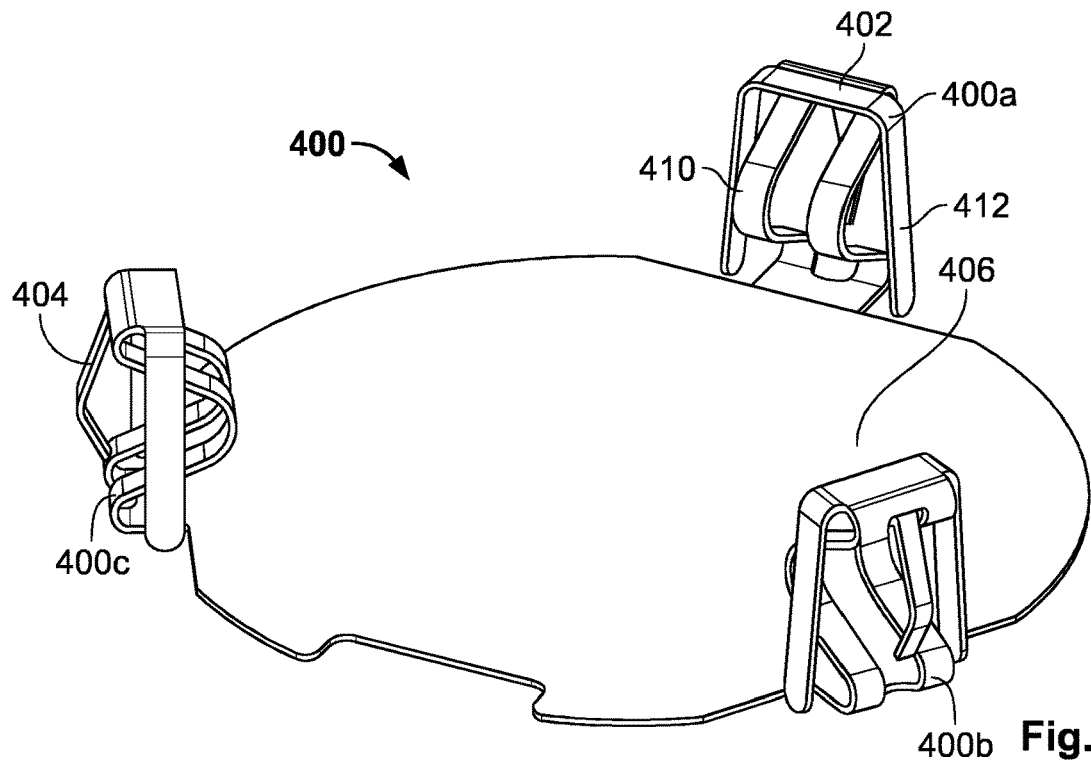
FIG. 9 is a perspective view of an electrically conductive spring according to another embodiment.
Figure 10:
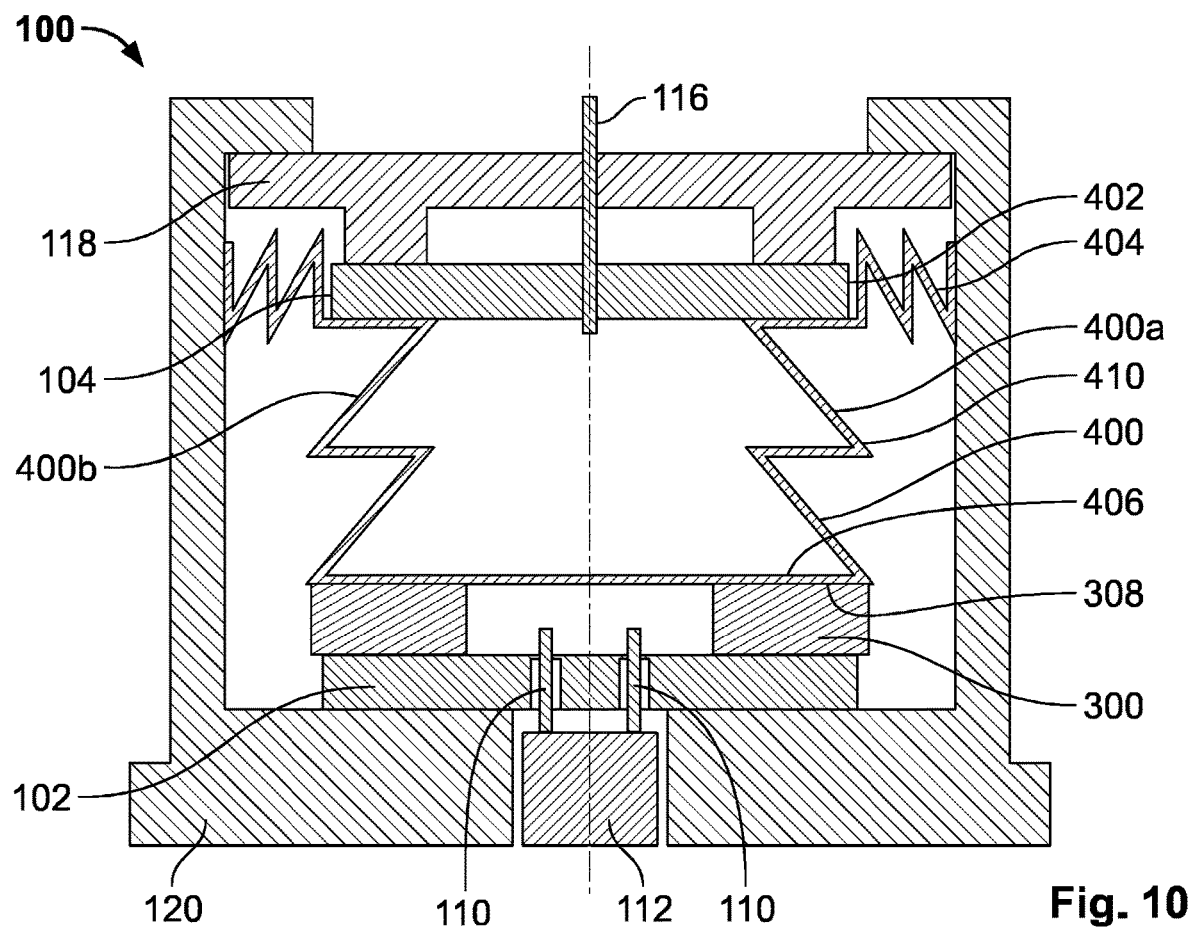
FIG. 10 is a sectional side view of the sensor device with the electrically conductive spring of FIG. 9.

FIG. 9 illustrates a schematic view of an electrically conductive spring element 400 for a sensor device 100 according to the first embodiment. FIG. 10 illustrates a schematic cut view of the sensor device 100 according to the first embodiment of the present invention comprising the spring element 400, as a variant of the spring 200. The FIGS. 9 and 10 are described together in the following. Elements with the same reference numeral already described and illustrated in FIG. 2 will not be described in detail again but reference is made to their description above.

The spring element 400, as shown in FIG. 9, comprises three springs 400a, 400b, 400c extending from a common shielding base 406. In an alternative, the spring element 400 comprises a shielding base 406 and only one spring 400a. In another variant, the spring element 400 comprises a shielding base 406 and two, four or more springs 400a, b, c, . . . The springs 400a, 400b, 400c are integrally formed with the shielding base 406. Hence, the spring element 400 is formed in one-piece. As the spring 200 according to the first variant, each of the springs 400a, 400b, 400c according to the second variant comprises a first flat portion 402 from which extend a second portion 404 performing the electrical grounding function and a third portion 410 performing the strain relief portion. Each springs 400a, 400b, 400c comprises, as in the first variant, two guiding arms 412 extending from the first portion 402.

In comparison with the spring 200, the springs 400a, 400b, 400c according to the second variant share a common base 406 that provides a shielding function to the PCBs 102, 104. Therefore, the base 406 of the spring element 400 is dimensioned so as to cover the base 308 of the plastic holder, substantially corresponding to the surfaces of the PCBs 102, 104 as shown in FIG. 10. Hence, when the shielding base 306 lies on the plastic holder 300, the shielding base 306 is disposed between the two PCBs 102, 104 (the plastic holder being disposed between the two PCBs), thereby preventing cross talk (i.e. unintentional electromagnetic coupling) between the two PCBs 102, 104. Therefore, the spring element 400 allows not only to perform a grounding function and a strain relief function but also an additional shielding function.

Figure 11:
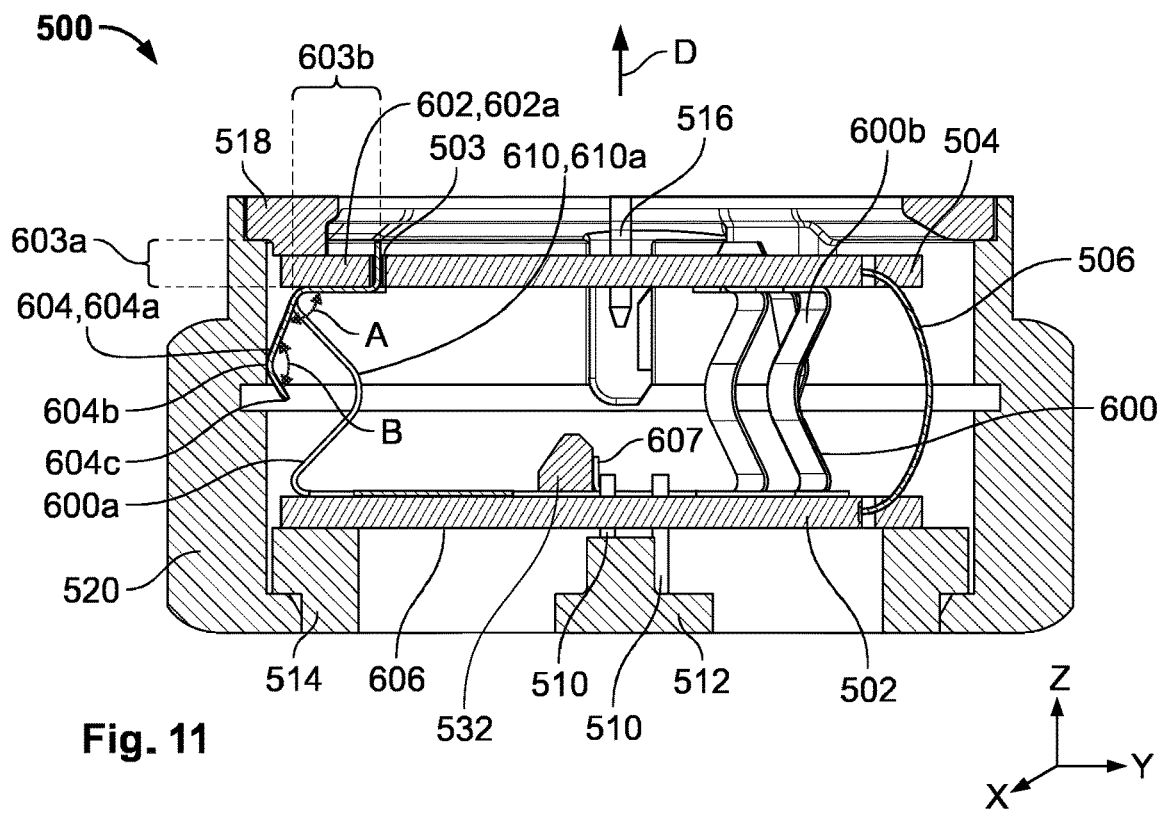
FIG. 11 is a sectional side view of a sensor device according to a second embodiment of the invention.

The FIG. 11 illustrates a cut view of a sensor device 500 according to a second embodiment of the present invention. Similarly as in the sensor device 100 according to the first embodiment, the sensor device 500 comprises a first PCB 502 connected to a second PCB 504 by a flexible electrically conductive device 506. The flexible electrically conductive device 506 provides a flexible electrical connection between the first PCB 502 and the second PCB 504. The flexible electrically conductive device 506 can be a PCB flex or flexible PCB 506. The flexible electrically conductive device 506 is formed of a thin insulating polymer film having conductive circuit patterns affixed thereto. The use of a flexible electrically conductive device 506, like a PCB flex, allows avoiding rigid interconnection between the first PCB 502 and the second PCB 504.

As shown in FIG. 11, terminal pins 510 are soldered to the first PCB 502. The terminal pins 510 extend from a terminal block 512 accommodated in a first assembly 514, like a header assembly 514, of the sensor device 500. Sensitive elements (not represented), like temperature sensor or resonator, are connected to the terminal pins 510. Terminal pins 516 are soldered to the second PCB 504. The terminal pins 516 are connectors for customer connection.

A second assembly 518, like a connector 518, and the header assembly 514 are held together by an electrically conductive body 520. The electrically conductive body 520 is adapted to accommodate the first PCB 502 and the second 504. The electrically conductive body 520 is attached to the header assembly 514 and to the connector 518 in the same way as the electrical conductive body 520 already described in reference with FIG. 2, to which reference is made.

In order to electrically ground the PCBs 502, 504 for electrostatic discharge (ESD) protection and for preventing electromagnetic interference (EMI noise), it is necessary to create an electrical connection between the PCBs and the electrically conductive body 520. The electrical grounding function is carried out by an electrically conductive element 600, shown in FIG. 11. The electrically conductive element 600 comprises at least two springs 600a, 600b extending from a common shielding base 606. In an alternative, the spring element 600 comprises a shielding base 606 and only one spring 600a. In another variant, the spring element 600 comprises a shielding base 606 and three or more springs 600a, b, . . . The two or more springs 600a, b have the same structure, the description of which therefore applies for each spring. The springs 600a, 600b are integrally formed with the shielding base 606. Hence, the spring element 600 is formed in one-piece.

In a variant, the sensor device 500 according to the second embodiment is provided with at least one spring 600a instead of the electrically conductive element 600, i.e. individual springs 600a, 600b that are not integrally formed with a common shielding base 606. The electrically conductive element 600 is disposed between the two PCBs 504, 502 such that the shielding base 606 rests on the first PCB 502.

As in the first embodiment, a first portion 602 of the spring 600a is pressed against the second PCB 504. Moreover, a second portion 504 of the spring 600a is pressed against the electrically conductive body 520 so as to maintain an electrical connection between the electrically conductive body 520 and the PCBs 502, 504.

Unlike the first embodiment, the sensor device 500 is not provided with a plastic holder so as to maintain the spring element 600. Instead, the spring element 600 is held between the two PCBs 502, 504 by a form-fit connection formed between a first portion 602 of the spring 600a of the spring element 600 and the second PCB 504.

As shown in FIG. 11, the first portion 602 of the spring 600 is a flat portion 602a in a plane parallel to the surfaces of the PCBs 502, 504. According to the second embodiment, the first portion 602 comprises a main section 603a terminated with a free-end section 603b, the free-end section 603b extending transversally from the main section 603a through a corresponding through hole 503 of the PCB 504. The form-fit connection between the free-end section 603b of the spring 600a and the PCB 504 allows maintaining the spring 600a, and thus the spring element 600, without the need of solder joints. The spring element 600 can therefore be held in the sensor device 500 without soldering.

In a variant, the free-end section 603b can have a shape or a structure so as to provide a snap-fit connection or a press-fit connection with the hole 503 of the PCB 504. The flat structure 602a of the first portion 602 provides a well-adapted contact surface for ensuring the electrical connection when the first portion 602 is pressed against the second PCB 504. In a variant (not represented), the first portion 602 is provided with a bump, the bump being pressed against said first portion 602 so as to further improve the electrical contact.

The second portion 604 is formed by a bent tab 604a shown in FIG. 11, the apex 604b of which is pressed against the electrically conductive body 520 in the assembled state of the sensor device 500. The bent tab 604a extends from the first portion 602 in a direction so as to form an angle A from the flat first portion 602. The bent tab 604a has a free-end 604c.

As illustrated in FIG. 11 for the spring 600a, the angle A between the first portion 602 and the second portion 604 and the angle B at the apex 604b of the second portion 604 are both adapted for allowing the apex 604b to be pressed against the electrically conductive body 520 in the assembled stated of the sensor device 500. The first portion 602 and the second portion 604, in particular at the apex 604b, can be covered by an electrically conductive layer to further improve the electrical contact. Such electrically conductive layer can be formed of gold plating over a nickel plating layer.

The spring 600a further comprises a third portion 610 extending between the first portion 602 and the shielding base 606, shown in FIG. 11, so that the third portion 610 does not have any free end. The third portion 610 of the spring 600a is configured to be in a preloaded state between the two PCBs 502, 504. The third portion 610 is thus structurally configured for imparting a sufficient spring force along a direction transversal D to the PCBs 502, 504 so as to provide strain relief to the PCBs 502, 504. The third portion 510 acts as a compression spring exerting its restoring force along the direction D. As shown in FIG. 11, the third portion 610 is a three-point bent tongue 610a. The shape of the third portion 610 advantageously allows increasing the working stroke of the spring 600a, and thus the spring element 600, while having a reduced bulk. In a variant, the third portion 610 acts as a compression spring but has a different structure than the design of the three-point bent tongue 610a of the spring 600a shown in FIG. 11.

The electrically conductive spring element 600 allows not only providing a grounding function but, in addition, a stress relief function which improves the retention of the PCBs 502, 504, especially under vibrations, as no stress is caused on and by rigid connections (like solder joints). Hence, the two functions of electrical grounding and strain relief of the PCBs 502, 504 are advantageously carried out by one single component, the electrically conductive element 600, that can be assembled to the sensor device 500 without the need of soldering step.

In order to further improve the retention of the shielding base 606 on the sensor device 500, the shielding base 606 can comprise a tongue 607 that extends transversally from the base 606. The shielding base 606 is arranged in the sensor device 500 such that the tongue 607 abuts on a locking element 532 protruding from the head assembly 514. The abutment of the tongue 507 against the locking element 532 prevents a displacement of the shielding base 606 in a plan (XY) parallel to the PCBs 502, 504.

Figure 12:
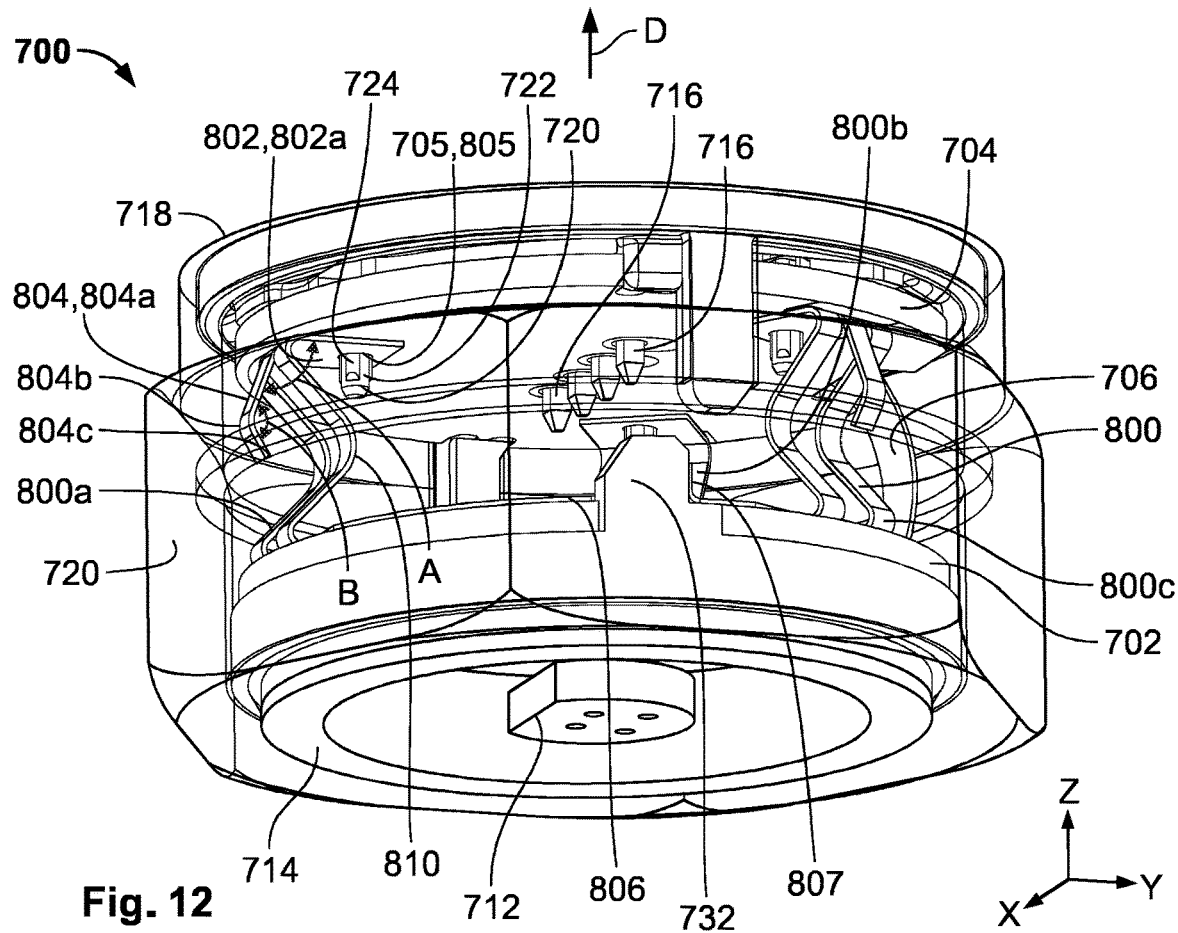
FIG. 12 is a perspective view of a sensor device according to a third embodiment of the invention.

FIG. 12 illustrates a cut view of a sensor device 700 according to a third embodiment of the present invention. Similarly as for the sensor devices 100 and 500 according to the first and second embodiments, the sensor device 700 comprises a first PCB 702 connected to a second PCB 704 by a flexible electrically conductive device 706. The flexible electrically conductive device 706 is similar than the flexible electrically conductive device 106, 506 already described above. The use of flexible electrically conductive device 706 allows avoiding rigid interconnection between the first PCB 702 and the second PCB 704.

Terminal pins (not visible in FIG. 12) are soldered to the first PCB 702. These terminal pins extend from a terminal block 712 accommodated in a first assembly 714, like a header assembly 714, of the sensor device 700. Sensitive elements (not represented), like temperature sensor or resonator, are connected to the terminal pins 710. Terminal pins 716 are soldered to the second PCB 704. The terminal pins 716 are connectors for customer connection.

A second assembly 718, like a connector 718, and the header assembly 714 are held together by an electrically conductive body 720, as shown in FIG. 12. The electrically conductive body 720 is adapted to accommodate the first PCB 702 and the second 704. The electrically conductive body 720 is attached to the header assembly 714 and to the connector 718 in the same way as the electrically conductive body 120 already described in reference with FIG. 2, to which reference is made.

In order to electrically ground the PCBs 702, 704 for electrostatic discharge (ESD) protection and for preventing electromagnetic interference (EMI noise), it is necessary to create an electrical connection between the PCBs and the electrically conductive body 720. The electrical grounding function is carried out by an electrically conductive element 800 shown in FIG. 12. The electrically conductive element 800 comprises three springs 800a, 800b, 800c extending from a common shielding base 806. In an alternative, the spring element 800 comprises a shielding base 806 and only one spring 800a. In another variant, the spring element 800 comprises a shielding base 806 and two or more springs 800a, b, . . . The two or more springs 800a, b have the same structure, the description of which therefore applies for each spring.

The springs 800a, 800b, 800c are integrally formed with the shielding base 806. Hence, the spring element 800 is formed in one-piece. In a variant, the sensor device 800 according to the third embodiment is provided with at least one spring 800a instead of the electrically conductive element 800, i.e. individual springs 800a, 800b that are not integrally formed with a common shielding base 806.

The electrically conductive element 800 is disposed between the two PCBs 702, 704 such that the shielding base 806 rests on the first PCB 702. As in the first and the second embodiments, a first portion 802 of the spring 800a is pressed against the second PCB 704. Moreover, a second portion 804 of the spring 800a is pressed against the electrically conductive body 720 so as to maintain an electrical connection between the electrically conductive body 720 and the PCBs 702, 704.

Unlike the first embodiment, the sensor device 700 is not provided with a plastic holder so as to maintain the spring element 800. Instead, the spring element 800 is held between the two PCBs 702, 704 by a press-fit connection formed between a first portion 802 of the spring 800a of the spring element 800 and the second PCB 704. The first portion 802 of the spring 800 is a flat portion 802a in a plan parallel to the surfaces of the PCBs 702, 704.

According to the third embodiment, the first portion 802 is provided with a through hole 805. In the variant shown in FIG. 12, the through hole 805 has a circular cross-section. However, in another variant, the through hole 805 has a cross-section with a different shape, like an oblong shape.

An assembly pin 720 extends from the second assembly 718, i.e. the connector 718 made in plastic material. The assembly pin 720, as shown in FIG. 12, has a substantially cylindrical main body 722 on which extends radially at least one longitudinal tongue 724. The cylindrical main body 722 assembly pin 720 has a similar diameter of the one of the through hole 805 of the first portion 802. Hence, when the assembly pin 702 is inserted through the PCB 704, via a corresponding through hole 705 of the PCB 704, the at least one longitudinal tongue 724 is slightly deformed in the through holes 705 of the PCB 704 and 805 of the springs 800a, thereby providing a press-fit connection. This press-fit connection between the first portion 802 of the spring 800a and the PCB 704 by the assembly pin 720 of the first assembly 718 of the sensor device 700 allows maintaining the spring 800a, and thus the spring element 800, without the need of solder joints. The spring element 800 can therefore be held in the sensor device 700 without soldering.

The flat structure 802a of the first portion 802 provides a well-adapted contact surface for ensuring the electrical connection when the first portion 802 is pressed against the second PCB 704. In a variant (not represented), the first portion 802 is provided with a bump, the bump being pressed against said first portion 802 so as to further improve the electrical contact.

As in the first and the second embodiment, the second portion 804 of the spring 800a is formed by a bent tab 804a, the apex 804b of which is pressed against the electrically conductive body 720 in the assembled state of the sensor device 700. The bent tab 804a extends from the first portion 802 in a direction so as to form an angle A from the flat first portion 802. The bent tab 804a has a free-end 804c.

As illustrated in FIG. 12 for the spring 800a, the angle A between the first portion 802 and the second portion 804 and the angle B at the apex 804b of the second portion 804 are both adapted for allowing the apex 804b to be pressed against the electrically conductive body 720 in the assembled stated of the device sensor 700. The first portion 802 and the second portion 804, in particular at the apex 804b, can be covered by an electrically conductive layer to further improve the electrical contact. Such electrically conductive layer can be formed of gold plating over a nickel plating layer.

As in the first and the second embodiment, the spring 800a further comprises a third portion 810 extending between the first portion 802 and the shielding base 806, so that the third portion 810 does not have any free end. The third portion 810 of the spring 800a is configured to be in a preloaded state between the two PCBs 702, 704. The third portion 810 is thus structurally configured for imparting a sufficient spring force along a direction transversal D to the PCBs 702, 704 so as to provide strain relief to the PCBs 702, 704. The third portion 810 acts as a compression spring exerting its restoring force along the direction D. As shown in FIG. 12, the third portion 810 is a three-point bent tongue 810a. The shape of the third portion 810 advantageously allows increasing the working stroke of the spring 800a, and thus the spring element 800, while having a reduced bulk. In a variant, the third portion 810 acts as a compression spring but has a different structure than the design of the three-point bent tongue 810a of the spring 800a shown in FIG. 12.

The electrically conductive spring element 800 allows not only providing a grounding function but, in addition, a stress relief function which improves the retention of the PCBs 702, 704, especially under vibrations, as no stress is caused on and by rigid connections (like solder joints). Hence, the two functions of electrical grounding and strain relief of the PCBs 702, 704 are advantageously carried out by one single component, the electrically conductive element 800, that can be assembled to the sensor device 700 without the need of soldering step.

In order to further improve the retention of the shielding base 806 on the sensor device 800, the shielding base 806 can comprise a tongue 807 that extends transversally from the base 806. The shielding base 806 is arranged in the sensor device 700 such that the tongue 807 abuts on a locking element 732 protruding from the head assembly 714. The abutment of the tongue 807 against the locking element 732 prevents a displacement of the shielding base 806 in a plan (XY) parallel to the PCBs 702, 704.

In comparison to the first embodiment, the sensor devices 500, 700 of the second and third embodiments are not provided with a plastic holder 300 for carrying the springs/spring element. Instead, the spring elements 600, 800 of the second and third embodiment are in direct surface contact with both PCBs 502, 504, 702, 704: the base 606, 806 is in direct contact with the first PCB 502, 702 and the first portion 602, 802 is in direct surface contact with the second PCB 504, 704. While the sensors 500, 700 of the second and third embodiment do not require an additional element, such as a plastic holder, they need the second PCB 504, 704 to be provided with a through hole 503, 705 so as to form a press-fit, snap-fit or form-fit connection with the first portion of the spring element 600, 800. The presence of a through hole in the PCB for maintaining the springs/spring element according to the first embodiment is not required thanks to the use of the plastic holder 300.

In a variant (not illustrated), the sensor devices 100, 500, 700 can comprise more than two PCBs, for example stacked over each other and with spring(s) or spring element arranged therebetween.

All of the first, second and third embodiments, provide a sensor device 100, 500, 700 wherein the electrically conductive spring/spring element performing both the grounding function and the strain relief function, is held by a snap-fit, a form-fit or a press-fit connection, i.e. without the need of soldering the electrically conductive spring/spring element.

As no soldering step is required to install the electrically conductive spring for ensuring the grounding function, the manufacturing is simplified, thereby improving the repeatability and reducing the cost of the assembly process. Consequently, the sensor device is rendered compatible for high volume production.

Moreover, with respect to the known solutions for electrical grounding in sensor devices wherein the contact spring is soldered to the PCB, damages caused on soldered joints by vibrations are prevented. Instead, the present invention provides sensor devices 100, 500, 700 without rigid connections between the two PCBs.

Although the embodiments have been described in relation to particular examples, the invention is not limited and numerous alterations to the disclosed embodiments can be made without departing from the scope of this invention. The various embodiments and examples are thus not intended to be limited to the particular forms disclosed. Rather, they include modifications and alternatives falling within the scope of the claims and individual features can be freely combined with each other to obtain further embodiments or examples according to the invention.

What is claimed is:
1. A sensor device, comprising:
an electrically conductive body adapted to accommodate a first printed circuit board (PCB) and a second PCB;
a flexible electrically conductive device connecting the first PCB and the second PCB;

a plastic holder held between the first PCB and the second PCB by a snap-fit, a form-fit, or a press-fit connection; and an electrically conductive spring mounted on the plastic holder, a first portion of the electrically conductive spring is pressed against one of the first PCB and the second PCB and a second portion of the electrically conductive spring is pressed against the electrically conductive body to maintain an electrical connection between the electrically conductive body, the first PCB, and the second PCB.

2. The sensor device of claim 1, wherein one of the first PCB and the second PCB is in direct surface contact with the plastic holder and the other of the first PCB and the second PCB is in direct surface contact with the electrically conductive spring.

3. The sensor device of claim 1, wherein the plastic holder has a base and a receptacle extending transversally from the base, the receptacle partially receives the electrically conductive spring.

4. The sensor device of claim 3, wherein the electrically conductive spring has a guiding arm extending from the first portion, the guiding arm received in a groove of the receptacle.

5. The sensor device of claim 2, wherein the plastic holder has a circumference with a recess receiving a locking element protruding from a first assembly element of the sensor device.

6. The sensor device of claim 2, wherein the plastic holder has a receptacle receiving a connector locking arm protruding from a second assembly element of the sensor device.

7. The sensor device of claim 6, wherein the receptacle has a receptacle locking arm and, in an assembled state of the sensor device, a snap-fit, a press-fit, or a form-fit connection is formed between the connector locking arm and the receptacle locking arm.

8. The sensor device of claim 1, wherein the electrically conductive spring is in direct surface contact with both the first PCB and the second PCB.

9. The sensor device of claim 1, wherein the first portion of the electrically conductive spring has a main section terminated with a free-end section extending transversally from the main section through a hole of the second PCB.

10. The sensor device of claim 1, wherein a snap-fit, a form-fit, or a press-fit connection is formed between the first portion of the electrically conductive spring and an assembly pin of an assembly element of the sensor device, the assembly pin extends through a hole of the second PCB and a hole of the first portion of the electrically conductive spring.

11. The sensor device of claim 1, wherein the first portion of the electrically conductive spring is a flat portion, the second portion is formed by a bent tab and protrudes from the first portion.

12. The sensor device of claim 1, wherein the first portion of the electrically conductive spring has a bump pressed against one of the first PCB and the second PCB, the second portion is formed by a bent tab and protrudes from the first portion.

13. The sensor device of claim 1, wherein the electrically conductive spring has a third portion extending from the first portion to a base of the electrically conductive spring, the base is geometrically opposed to the first portion and the third portion is in a preloaded state between the first PCB and the second PCB.

14. The sensor device of claim 1, wherein the electrically conductive spring is integrally formed with a shielding base and extends transversally from the shielding base, the shielding base is arranged parallel between the first PCB and the second PCB.

15. A method for assembling a sensor device, comprising:

mounting an electrically conductive spring to a plastic holder along an insertion direction;

disposing the plastic holder on a first printed circuit board (PCB) along the insertion direction, the first PCB is connected to a second PCB by a flexible electrically conductive device;

arranging the second PCB over the plastic holder to press a first portion of the electrically conductive spring against the second PCB; and assembling an electrically conductive body accommodating the first PCB and the second PCB to press a second portion of the electrically conductive spring against the electrically conductive body to maintain an electrical connection between the electrically conductive body, the first PCB, and the second PCB.

16. The method of claim 15, wherein a guiding arm of the electrically conductive spring is received in a groove of a receptacle of the plastic holder.

17. The method of claim 15, wherein, in the arranging step, the second PCB connected to a connector is moved pivotally onto the plastic holder about a rotational axis transversal to the insertion direction.

18. The method of claim 15, wherein, in the assembling step, the plastic holder is held in position by a snap-fit, a press-fit, or a form-fit connection.

* * * * *